United States Patent [19]

Okumura

[11] Patent Number: 4,481,521
[45] Date of Patent: Nov. 6, 1984

[54] INSULATED GATE FIELD EFFECT TRANSISTOR PROVIDED WITH A PROTECTIVE DEVICE FOR A GATE INSULATING FILM

[75] Inventor: Koichiro Okumura, Tokyo, Japan
[73] Assignee: Nippon Electric Co., Ltd., Tokyo, Japan
[21] Appl. No.: 295,367
[22] Filed: Aug. 24, 1981

Related U.S. Application Data

[63] Continuation of Ser. No. 091,402, Nov. 6, 1979, abandoned.

[30] Foreign Application Priority Data

Nov. 6, 1978 [JP] Japan ................................ 53-136570

[51] Int. Cl.[3] ............................................ H01L 29/78
[52] U.S. Cl. ...................................... 357/23; 357/41; 357/51; 361/56; 361/91; 361/111
[58] Field of Search ............... 357/23, 41, 51; 361/91, 361/56, 111

[56] References Cited

U.S. PATENT DOCUMENTS 3,819,952  6/1974  Enomoto et al. ............. 357/23 GP

FOREIGN PATENT DOCUMENTS 54-116887  9/1979  Japan ............................ 357/23 GP Primary Examiner—Joseph E. Clawson, Jr.
Attorney, Agent, or Firm—Fitzpatrick, Cella, Harper & Scinto

[57] ABSTRACT

An improved protective device for the gate insulation of an integrated-gate field effect transistor (IGFET) is disclosed that does not breakdown under spike-like input voltages. The protective device is formed on the same semiconductor chip as an operative IGFET and includes a resistor connected between the input terminal and the operative IGFET's gate, a protective IGFET whose drain and gate are both connected to the operative IGFET's gate, and another resistor connected between the protective IGFET's source and a constant voltage source.

10 Claims, 6 Drawing Figures

INSULATED GATE FIELD EFFECT TRANSISTOR PROVIDED WITH A PROTECTIVE DEVICE FOR A GATE INSULATING FILM

This is a continuation of application Ser. No. 091,402, filed 11/6/79, now abandoned.

BACKGROUND OF THE INVENTION

The present invention relates to a protective device for a gate insulating film or the life in an insulated gate field effect transistor (hereinafter referred to as IGFET).

DESCRIPTION OF THE PRIOR ART

For the purpose of improving the electrical performance of an IGFET such as by decreasing the threshold voltage and increasing the voltage gain, it is preferable to make the gate insulating film thinner. However, if the gate insulating film is made thinner, the dielectric breakdown voltage of the gate insulating film is lowered. For instance, in the case of employing a silicon oxide film of about 500 Å in thickness as the gate insulating film, it will be subjected to permanent breakdown by a voltage of about 60 V. Examples of known protective devices for protecting the gate insulating film from such breakdown, are the protective devices illustrated in FIGS. 1 and 2.

More particularly, in the first example (FIG. 1) of the prior art protective devices, a drain-source path of a protective IGFET is connected between the gate and the source of an IGFET which is to be protected. The gate of the IGFET to be protected is connected through a resistor to an input terminal, and to this input terminal is connected the gate of the protective IGFET. In this case, the gate insulating film in the protective IGFET must be so thick that the threshold voltage of the protective IGFET is high enough to make it inoperative for an input signal within the normal operation range of the IGFET to be protected. Consequently, this prior art protective device has the shortcoming that even when the protective IGFET has been made conductive by an excessive input signal, the voltage applied to the gate of the IGFET to be protected cannot be sufficiently lowered due to the relatively large dynamic resistance of the source-drain path of the protective IGFET. If the channel width of the protective IGFET is selected wide in order to lower the dynamic resistance, then there occurs another shortcoming in that the occupation area on a chip occupied by the protective IGFET itself becomes wide.

In the second example (FIG. 2) of the prior art protective devices, there is provided a protective IGFET having its gate and drain connected to the gate of an IGFET to be protected, and its source held at a power supply potential or at a predetermined constant potential. An input signal is applied through a resistor to the gate of the IGFET to be protected. In this second example, since the threshold voltage of the protective IGFET can be varied by arbitrarily presetting the source potential of the protective IGFET, the thickness of the gate insulating film in the protective IGFET can be made as thin as that of the IGFET to be protected, so that the dynamic resistance of the source-drain path of the protective IGFET upon operation can be made sufficiently small. However, this prior art protective device also has a shortcoming in that since the gate insulating film of the protective IGFET is thin, an abruptly rising excessive voltage such as, for example, a spike-like pulse voltage will cause breakdown of the protective IGFET before it achieves the protective function.

SUMMARY OF THE INVENTION

One object of the present invention is to provide an insulated gate field effect transistor provided with a protective device for its gate insulating film, in which the protective device would not be broken down even a spike-like voltage is applied thereto, and which is suitable to be formed in the same semiconductor chip together with the amplifying part of the insulated field effect transistor.

The insulated gate field effect transistor according to the present invention comprises an insulated gate field effect transistor to be protected, a protective insulated gate field effect transistor whose drain and gate are electrically connected to the gate of the insulated gate field effect transistor to be protected, a first resistor connected to the gate of the transistor to be protected, and a second resistor inserted between the source of the protective insulated gate field effect transistor and a source of constant voltage.

BRIEF DESCRIPTION OF THE DRAWINGS

The above and further objects, features and advantages of the present invention will become more apparent from the following detailed description taken in conjunction with the accompanying drawings, wherein:

FIG. 5 is a diagram showing a relation of the dielectric breakdown voltage of the gate insulation film vs. the resistance of the second protective resistor in the protective device according to the present invention shown in FIG. 3.

DESCRIPTION OF THE PREFERRED EMBODIMENT

Figure 1:
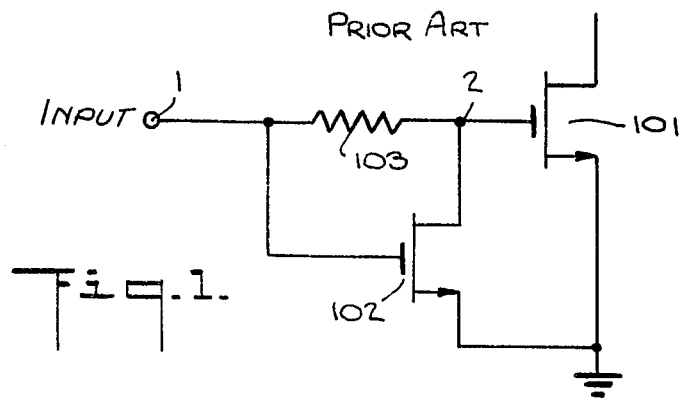
FIGS. 1 and 2 are circuit diagrams, respectively, showing insulated gate field effect transistors provided with prior art protective devices for gate insulating films.

First the construction and operation of an IGFET provided with a prior art protective device as shown in FIG. 1 will be described. In the following description, by way of example, it is assumed that IGFET's are of the N-channel type. A gate of an IGFET 101 to be protected is connected to a junction 2 and then through a protective resistor 103 to an input terminal 1. The drain-source path of a protective IGFET 102 is connected between the gate and source of the IGFET 101 to be protected. The gate of the protective IGFET 102 is connected to the input terminal 1.

The threshold voltage of the protective IGFET 102 is chosen to be higher than that of the IGFET 101 to be protected but lower than the dielectric breakdown voltage of the gate insulating film of the IGFETf 101 to be protected. Accordingly, when an input signal voltage is within the normal operation range of the IGFET 101 to be protected, the source-drain path of the protective IGFET 102 is not conducting, and hence normal operation of the IGFET 101 to be protected can occur. On the other hand, in cases where an excessive voltage higher than the breakdown voltage of the gate insulating film of the IGFET 101 to be protected is applied to the input terminal 1, the source-drain path of the protective IGFET 102 becomes conducting. Therefore, the voltage at the junction 2, that is, the virtual input voltage to the gate of the IGFET 101 to be protected is determined by voltage division between the resistor 103 and the dynamic resistance of the source-drain path of the protective IGFET 102, so that the excessive voltage applied to the input terminal 1 is attenuated and then applied to the gate of the IGFET 101. Owing to this attenuation of the excessive voltage applied to the input terminal 1, the gate insulating film of the IGFET 101 to be protected can be protected from breakdown.

However, since the insulating film of the protective IGFET 102 is generally sufficiently thicker than that of the IGFET 101 to be protected (to make the threshold voltage of the former higher), the dynamic resistance of the source-drain path of the protective IGFET 102 is not sufficiently small as compared to the resistance of the protective resistor 103, and hence sufficient attenuation of excessive voltage applied to the input terminal 1 cannot be attained. Thus, this type of prior art protective device is sufficient in a gate protective function for the IGFET 10. Although the dynamic resistance of the protective IGFET 102 can be reduced and the protective effect can be enhanced by making the thickness of the gate insulating film thinner, in that case even an input signal within the normal operation range of the IGFET 101 to be protected is by-passed by the protective IGFET 102, and therefore, the normal operation of the IGFET 10 to be protected is hampered. Also, reducing the thickness has another shortcoming in that it is accompanied by the risk of causing breakdown of the gate insulating film of the protective IGFET 102 itself. Alternatively, the dynamic resistance of the source-drain path of the protective IGFET 102 can be reduced by increasing the channel width. This has still another shortcoming in that the occupation area of the protective device on a semiconductor chip is increased.

Now the other prior art protective device illustrated in FIG. 2 will be described. The gate of an IGFET 111 to be protected is connected through a junction 13 and a protective resistor 113 to an input terminal 11. The source of a protective IGFET 112 is connected at a junction 12 to a wiring 14 for feeding a power supply voltage to the source. The drain and gate of the protective IGFET 112 are connected to the gate of the IGFET 111 to be protected. Both the IGFET's 111 and 112 are simultaneously produced through the same manufacturing process, so that the thickness of the gate insulating film and the threshold voltage of the protective IGFET 112 are equal to those of the IGFET 111 to be protected.

Figure 2:
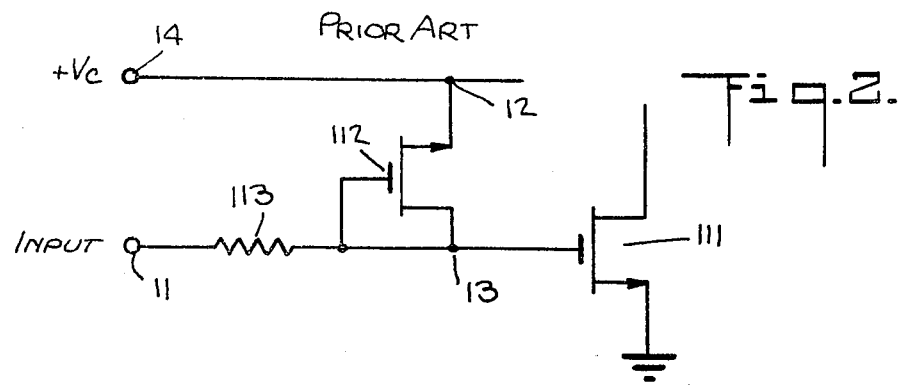

In this second example of a prior art IGFET provided with a protective device, as shown in FIG. 2, when the voltage applied to the input terminal 11 is lower than the sum of the constant voltage potential ($+V_c$) at the wiring 14 and the threshold voltage of the protective IGFET 112, the source-drain of the protective IGFET 112 remains non-conducting, and hence the IGFET 111 to be protected can operate normally. On the contrary, in the case where the voltage applied to the input terminal 11 is higher than the sum of the constant voltage potential ($+V_c$) at the wiring 14 and the threshold voltage of the protective IGFET 112, the source-drain path of the protective IGFET 112 becomes conducting, and thus the path of the IGFET 111 may be protected by fixing the potential at the gate of the IGFET 111 to the sum of the potential at the wiring 14 and the threshold voltage of the protective IGFET 112. Therefore, even in the case where an excessive voltage is applied to the input terminal 11, the input voltage can be effectively prohibited from being applied directly to the gate of the IGFET 111 to be protected, so that the IGFET 111 to be protected can be protected from application of an excessive input voltage.

Further, as compared to the prior art protective device illustrated in FIG. 1, the thickness of the gate insulating film of the protective IGFET 112 can be made thinner and thus the dynamic resistance of the source-drain path can be made smaller. Therefore, especially in the case where the input signal applied to the input terminal 11 is a D.C. voltage of about 100 V or lower, a remarkable protective effect for the IGFET 111 to be protected is obtained by the protective IGFET 112 occupying a small area on the semiconductor chip. On the other hand, however, if the thickness of the gate insulating film of the protective IGFET 112 is thin, the gate insulating film of the protective IGFET 112 can easily suffer from a dielectric breakdown. If a spike-like pulse of about several hundred volts that is occasionally produced by discharging of a static electric charge under normal conditions is applied to the input terminal, the gate insulating film of the protective IGFET 112 will be broken down in the vicinity of the source. For instance, in the prior art IGFET provided with a protective device shown in FIG. 2 using a silicon oxide film of 500 Å in thickness as the gate insulating film, it has been found that, if the resistance of the protective resistor 113 is chosen to be 1KΩ, the gate insulating film is broken down by a spike-like voltage of about 220 V.

Now, the present invention will be described in greater detail with reference to FIG. 3. The gate of an IGFET 121 to be protected (an operative IGFET) is connected through a first resistive element, such as protective resistor 123, to an input terminal 21. Both the drain and the gate of a protective IGFET 122 are commonly connected to the first protective resistor 123 and the gate of the IGFET 121 to be protected. The source of the protective IGFET 122 is connected through a second resistive element, such as protective resistor 124, to a wiring 24 which supplies a power supply voltage or a predetermined constant voltage ($V_c$). The constant voltage applied to the wiring 24 is preferably selected to be a D.C. voltage higher than the threshold voltage of the IGFET 121 by one volt. Even if the thicknesses of the gate insulating films and the threshold voltages are different between the IGFET 121 to be protected and the protective IGFET 122, no problem in operations will occur so long as the protective IGFET 122 has a threshold voltage in an enhancement mode. However, since it is more advantageous in the manufacturing process to form both the IGFET's 121 and 122 simultaneously, normally the thicknesses of the gate insulating films and the threshold voltages of the IGFET's 121 and 122, respectively, will be selected to be equal to each other.

Figure 3:
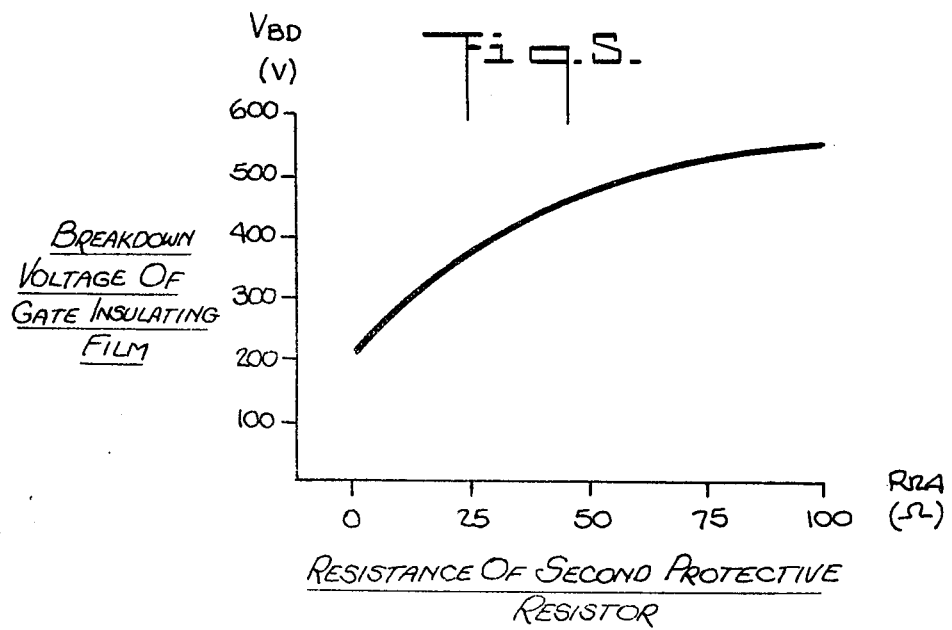
FIG. 3 is a circuit diagram showing one preferred embodiment of the present invention.
Figure 3:
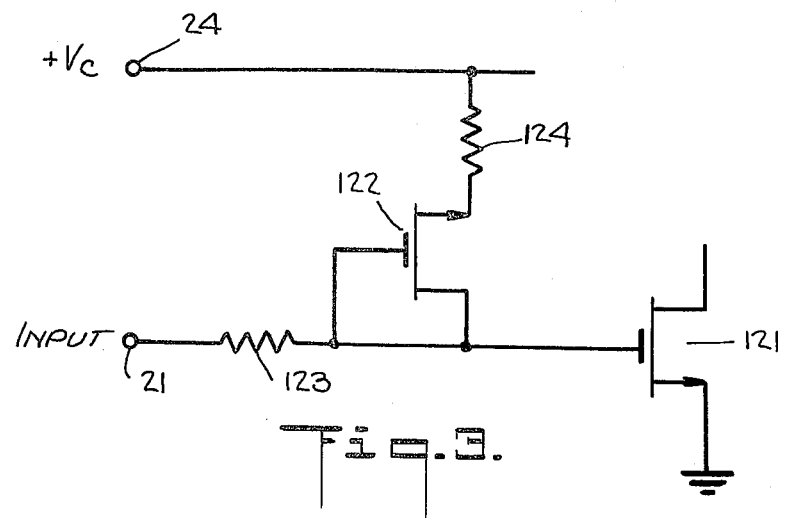
Figure 4A:
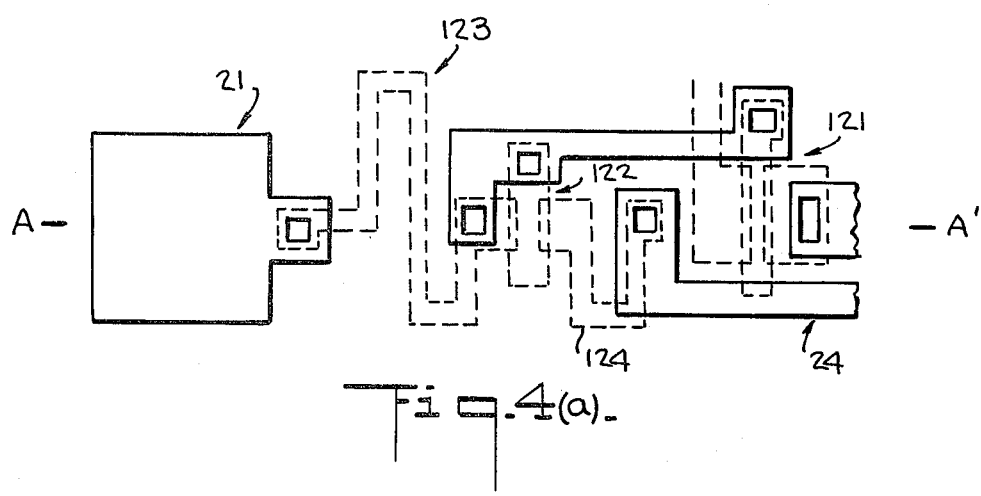
FIG. 4(a) is a plan view of the semiconductor chip embodying the above preferred embodiment shown in FIG. 3.
Figure 4B:
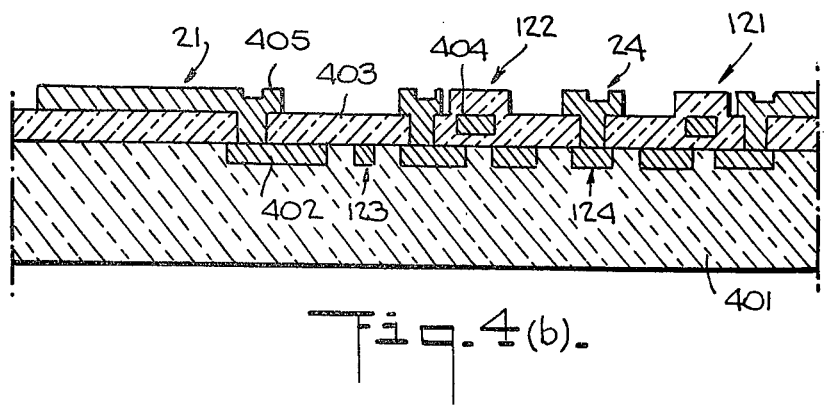
FIG. 4(b) is a sectional view taken along the A—A' of the semiconductor chip shown in FIG. 4(a)

The IGFET having the equivalent circuit shown in FIG. 3 can be realized in a semiconductor integrated circuit form as shown in FIGS. 4(a) and 4(b). A P-type silicon substrate 401 having an impurity concentration of $10^{15} cm^{-3}$ is subjected to an N-type impurity diffusion to form N-type regions 402 having an impurity concentration of $10^{19} cm^{-3}$. The N-type regions 402 are used as ohmic contact regions to the metal wiring layer 405, as source and drain regions of the IGFET's 121 and 122, and as resistors 123 and 124. The metal wiring layer 405 is deposited on the $S_iO_2$ covering layer 403 which is formed on the silicon substrate 401 and which provides apertures for connection of the metal wiring layer 405 to the N-type regions 402. Polycrystalline silicon layer 404 is embedded in the $S_iO_2$ covering layer 403 to form gate electrodes of the IGFET's 121 and 122. The $S_iO_2$ covering layer 403 under the polycrystalline silicon layer 404 has a thickness of 300~1200 Å (typically 500 Å) to form a gate insulating film. An IGFET having a gate insulating layer thinner than 300 Å has an extremely low gate break-down voltage so that the gate protection may be impossible by any protective devices. On the contrary, an IGFET having a gate insulating layer thicker than 1200 Å has a sufficiently high gate breakdown voltage, so that the gate breakdown may hardly occur. The N-type regions 402 for resistors 123 and 124 are designed to form a winding in order to provide predetermined resistances, such as 500 ohms for the resistor 123 and 50~100 ohms for the resistor 124.

Next, the operation of the IGFET provided with a protective device illustrated in FIG. 3 will be described. In the case where the voltage applied to the input terminal 21 is a D.C. voltage, since the dynamic resistance of the source-drain path of the protective IGFET 122 upon conducting is approximately equal to or smaller than the resistance of the first protective resistor 123 and is far larger than the resistance of the second protective resistor 124, this protective device comprising the IGFET 122 and the resistors 123 and 124 can operate in the same manner as the prior art protective device illustrated in FIG. 2. The protective effect is also substantially equal to that of the protective device in FIG. 2. However, upon application of a spike-like pulse voltage which will result in electrostatic breakdown under a practical storage condition, the protective device shown in FIG. 3 has a far more excellent protective capability than the prior art protective device shown in FIG. 2. First, the operation will be explained in the case of the prior art protective device shown in FIG. 2. When a spike-like high voltage is applied to the input terminal 11, the high voltage is in itself applied to the gate of the protective IGFET 112. This is because a noise source producing a high voltage noise such as a noise based on static electric charge generally has a very high internal resistance. However, the voltage at the source of the protective IGFET 112 is kept at the constant voltage potential of the wiring 14. The potential on the wiring 14 is about several volts under the operating condition of the semiconductor integrated circuit and is approximately equal to the ground potential under the non-operating storage condition of the circuit. Consequently, the gate insulating film of the protective IGFET 112 is broken down in the vicinity of its source. Whereas in the protective device illustrated in FIG. 3, since a second protective resistor 124 is inserted between the source of the protective IGFET 122 and the constant voltage source wiring, terminal 24, when a spike-like high voltage is applied to the input terminal 21, the current flowing through the drain-source path of the protective IGFET 122 flows through the second protective resistor 124 resulting in a voltage drop across the resistor 124, so that the source potential of the protective IGFET 122 is lowered and determined by voltage division with the dynamic resistance of the protective IGFET 122 and the resistance of the protective resistor 124. Consequently, the potential difference between the source and gate of the protective IGFET 122 becomes far smaller than that in the case of the prior protective device shown in FIG. 2, and hence, upon application of a spike-like high voltage the gate insulating film of the protective IGFET 122 itself can be protected from breakdown.

One example of the effect of the present invention is now demonstrated by referring to the diagram in FIG. 5. As a specimen, an N-channel silicon gate FET having a gate oxide film of 500 Å in thickness was used as the protective IGFET 122, and a resistor of 500 ohms formed by diffusion of N-type impurity was employed as the first resistor 123. The resistance of the second resistor 124 was varied. With regard to the method of employment, a capacitance of 200 pF had been preliminarily charged up to a high voltage, then this high voltage was applied to the protective device through a mercury contact switch, and then the voltage at which the protective device breaks down was taken along the ordinate of the diagram in FIG. 5, while the resistance Rs of the second protective resistor 124 in FIG. 3 was taken along the abscissa of the same diagram. In FIG. 5, the breakdown voltage corresponding to the resistance Rs=0 is the breakdown voltage of the prior art protective device shown in FIG. 2. From the experimental data for the relation of a breakdown voltage of a gate insulating film versus a resistance of a second protective resistor, the excellent performance of the protective device according to the present invention is self-evident. Especially when a protective resistor of 50Ω or higher is used, a breakdown voltage of a gate insulating film of 500~600 V can be attained, and the value of this breakdown voltage is not raised even at a higher resistance. Furthermore, the protective device according to the present invention has the advantage of the prior art protective device shown in FIG. 2 that the occupation area on the semiconductor chip is small, owing to the fact that the dynamic resistance of the protective IGFET is low. In view of this advantage, it is favorable to choose the resistance of the resistor 124 lower than about 100Ω in the case of forming the resistor 124 as a diffused resistor. If the second protective resistor 124 is 100 ohms, the occupation area of the protective device consisting of the protective IGFET 122, the first and the second protective resistors 123 and 124 is 107 percent of the area occupied by the prior art protective device consisting of IGFET 112 and the protective resistor 113 shown in FIG. 2, and if the resistor 124 is 200 ohms, the occupation area is 114 percent. Thus, where the resistance of the second protective resistor 124 exceeds 100 ohms, the merit of area is not so good and the cost of the device is relatively raised. And when the area is increased, stray capacitance increases to hamper high frequency operation. Thus by selecting the resistance of the second protective resistor 124 at a value within the range of about 50 to 100Ω, the advantage of the present invention can be realized more effectively. The tendency of the breakdown voltage change is similar in the case where the protective IGFET 122 having a gate oxide film of 300~1200 Å and the first resistor 123 having a resistance lower than 300 ohms are employed.

While the present invention has been described above, by way of example, in connection with N-channel IGFET's, it is a matter of course that the IGFET provided with a protective device according to the present invention is equally effective in the case of employing P-channel IGFET's. Moreover, since it is known that the breakdown voltage of the protective IGFET 122 according to the present invention is not affected by the resistance of the first covering resistor 123 of almost 0 ohm against the noise such as a spike-like high voltage pulse generated by a noise source whose equivalent internal resistance is considered to be large, this first protective resistor 123 may be omitted against the noise generated from a noise source having a high internal resistance. Further, the protective device comprising the IGFET 122 and the second protective resistor 124 may be connected to the drain of the IGFET 121 to be protected for protecting the drain junction from breakdown. In this case, since the drain current derived from the IGFET 121 is large in value, the first protective resistor 123 is preferably designed to be of small resistance or may be omitted.

What is claimed is:

1. An insulated-gate field effect transistor device comprising:
   an operative insulated-gate field effect transistor having a predetermined threshold voltage,
   a protective insulated-gate field effect transistor having a threshold voltage substantially equal to said predetermined threshold voltage, whose drain and gate are coupled to the gate of said operative transistor,
   a first resistive element coupled at one end to the gate of said operative transistor, the other thereof forming an input terminal and said first resistive element having a resistance value which is equal to or greater than the value of the dynamic resistance of the conducting source-drain path of the protective transistor and
   a second resistive element connected at one end to the source of said protective transistor, the resistance value of said second resistive element being much smaller than said dynamic resistance and the other end of said second resistive element being coupled to a terminal for connection to a voltage source.

2. An insulated-gate field effect transistor device comprising:
   an operative insulated-gate field effect transistor having a predetermined threshold voltage,
   a protective insulated-gate field-effect transistor of having substantially the same threshold voltage as said predetermined threshold voltage, said protective insulated-gate field effect transistor having a drain and a gate coupled together to the gate of said operative transistor,
   an input terminal,
   a first resistive element coupled between said gate of said operative transistor and said input terminal,
   a voltage terminal held at constant voltage having such a value that can make said operative transistor conductive if said constant voltage is applied to said gate of said operative transistor, and
   a second resistive element connected between said voltage terminal and source of said protective transistor as the sole direct connection of a source-drain path of any transistor between said voltage terminal and said gate of operative transistor.

3. An insulated-gate field effect transistor device as claimed in claim 1, wherein the second resistive element has a resistance value of 50 to 100 ohms.

4. An insulated-gate field effect transistor device as claimed in claim 3, wherein the first resistive element has a resistance value of 500 ohms.

5. An insulated-gate field effect transistor device as claimed in claim 2, wherein the operative and protective transistors are formed on the same semiconductor integrated circuit chip and have gate insulating film thicknesses that are the same.

6. An insulated-gate field effect transistor device as claimed in claim 5, wherein the respective gate insulating film thicknesses are 300 to 1200 Angstroms.

7. An insulated-gate field effect transistor device comprising:
   an operative field effect transistor having a source region and a drain region on a semiconductor substrate and a gate electrode disposed on said semiconductor substrate between said source and drain regions through a gate insulator film,
   a protective field effect transistor having a source region and a drain region on a semiconductor substrate and a gate electrode disposed on said semiconductor substrate between said source and drain region through a gate insulator film having a thickness substantially equal to that of said insulator film of said operative field effect transistor, means for connecting said gate electrode and one of said drain and source regions of said protective field effect transistor to said gate electrode of said operative field effect transistor,
   a first resistive element connected at one end to said gate electrode of said operative field effect transistor, the other end thereof being coupled to an input terminal, and
   a second resistive element connected at one end to the other of said drain and source regions of said protective field effect transistor, the other end of said second resistive element being connected to a terminal held at a voltage sufficient to turn on said operative field effect transistor when said voltage is applied to said gate electrode of said operative field effect transistor, said second resistive element and the source-drain path of said protective field effect transistor being the sole direct connection via any source-drain path between said gate electrode of said operative field effect transistor and said terminal held at said voltage.

8. An insulated-gate field effect transistor device as claimed in claim 7, wherein said operative and protective field effect transistors are formed on a single semiconductor substrate.

9. An insulated-gate field effect transistor device as claimed in claim 8, wherein said second resistive element is formed on said semiconductor substrate as an extending region of said source region of said protective field effect transistor.

10. An insulated-gate field effect transistor device as claimed in claim 8, wherein said first resistive element is formed on said semiconductor substrate as an extending region of said drain region of said protective field effect transistor.

* * * * *

UNITED STATES PATENT AND TRADEMARK OFFICE
CERTIFICATE OF CORRECTION

PATENT NO. : 4,481,521

DATED : November 6, 1984

INVENTOR(S) : Koichiro Okumura

It is certified that error appears in the above-identified patent and that said Letters Patent is hereby corrected as shown below:

Column 2, line 10, after "even", insert -- when --;

Column 3, line 26, "sufficient" to read -- insufficient --;

line 27, "10" to read -- 101 --;

line 34, "10" to read -- 101 --;

Column 4, line 2, "path" to read -- gate --;

Column 5, line 15, delete "the";

line 45, delete "in";

line 48, "charge" to read -- charges --;

Column 6, line 4, after "prior", insert -- art --;

line 13, "a" to read -- an --;

line 17, "employment" to read -- measurement --;

Column 7, line 5, after "first", insert -- protective --.

Column 7, line 5, delete "covering --.

Signed and Sealed this

*Fourth* Day of *June 1985*

[SEAL]

*Attest:*

DONALD J. QUIGG

*Attesting Officer*      *Acting Commissioner of Patents and Trademarks*